United States Patent
Hanson et al.

[11] Patent Number: 6,127,878
[45] Date of Patent: Oct. 3, 2000

[54] DRIVER CIRCUIT WITH NEGATIVE LOWER POWER RAIL

[75] Inventors: David R. Hanson, Brewster; Gerhard Mueller, Wappingers Falls, both of N.Y.

[73] Assignees: Siemens Aktiengesellschaft, Munich, Germany; International Business Machines Corporation, Armonk, N.Y.

[21] Appl. No.: 09/225,664

[22] Filed: Jan. 5, 1999

[51] Int. Cl.[7] .................................................. H03K 17/04
[52] U.S. Cl. ........................................ 327/374; 327/112
[58] Field of Search ........................ 326/17, 86; 327/108, 327/109, 110, 111, 112, 374, 376, 390, 427, 536

[56] References Cited

U.S. PATENT DOCUMENTS

| | | | |
|---|---|---|---|
| 4,959,561 | 9/1990 | McDermott et al. | 307/443 |
| 4,984,202 | 1/1991 | Kawahara et al. | 365/177 |
| 5,426,334 | 6/1995 | Skovmand | 327/427 |
| 5,703,825 | 12/1997 | Akiba et al. | 365/229 |
| 5,808,956 | 9/1998 | Maruyama | 365/230.06 |

FOREIGN PATENT DOCUMENTS

0 821 362  1/1998  European Pat. Off. .

*Primary Examiner*—Jeffrey Zweizig
*Attorney, Agent, or Firm*—Stanton C. Braden

[57] ABSTRACT

A high frequency driver circuit is described. The driver produces increased current flow at its output to decrease charging time, thereby enabling higher frequency operations. Increased current flow is achieved by providing an active control signal that increases the magnitude of the overdrive voltage applied to a driver transistor.

16 Claims, 8 Drawing Sheets

DRIVER CIRCUIT WITH NEGATIVE LOWER POWER RAIL

FIELD OF THE INVENTION

This disclosure relates to semiconductor devices. More particularly, the disclosure relates to a driver circuit that enables high frequency operation.

BACKGROUND OF THE INVENTION

Due to higher frequencies at which semiconductor integrated circuits (ICs) operate, IC designers are confronted with smaller or tighter operating windows. For example, in memory ICs such as dynamic random access memories (DRAMs), it is becoming more difficult to perform certain operations such as reads, writes, or precharges within a chip's cycle time. An aspect that limits the speed of operations in memory ICs is the charging of bus lines. For example, there are buses that need to be charged to an appropriate level within a clock cycle. Clocking the operation of ICs is a well established concept. Higher operating frequencies make it increasingly difficult for a driver circuit to charge buses within the given clock cycle.

The inability of the charge circuitry to charge the buses within the given time may require a modification in the chip's operational specification. For example, a DRAM may require a wait cycle after a write operation before a read operation can be performed. However, such a solution is undesirable as it impairs performance.

A conventional technique for improving the performance of the driver is to increase the voltage to which the driver charges the load. This produces an increase in the differential or voltage swing between the logic high and logic low voltage levels. The larger voltage swing between the high and low levels requires a greater amount of time to charge and discharge, for example, the buses, causing a degradation in performance. Additionally, increasing the voltage increases the power consumption, which is undesirable, particularly with portable systems such as laptop computers.

As evidenced by the above discussion, it is desirable to provide an improved driver circuit with an increase in charge rate that allows for faster operation of ICs.

SUMMARY OF THE INVENTION

The invention relates to a driver circuit that enables high frequency operation. High frequency operation is achieved by causing the driver circuit to operate in an increased overdrive mode, resulting in increased current flow at the output of the driver. A driver control signal is provided for activating and deactivating the driver circuit. In one embodiment, the control signal that activates the driver is negative with respect to ground, causing the driver to operate in the increased overdrive mode. In one embodiment, the active control signal is equal to about the negative word line voltage in a memory integrated circuit.

DESCRIPTION OF THE INVENTION

The invention relates to semiconductor devices and, more particularly, to a driver circuit for use with semiconductor devices. The semiconductor devices may be, for example, memory circuits such as random access memories (RAMs), dynamic RAMs (DRAMs), synchronous DRAMs (SDRAMs), high speed DRAMs such as SLDRAMs or Rambus DRAMs, non-volatile ferroelectric RAMs (FRAMs), or static RAMs (SRAMs). The semiconductor devices nay also be logic devices such as programmable logic arrays (PLAs), application specific integrated circuits (ASICs), merged DRAM-logic ICs (embedded DRAMs), or any other circuit devices. The semiconductor devices are used in, for example, consumer electronic products such as computer systems, office equipment including copiers and printers, cellular phones, personal digital assistants (PDAs), and other electronic products.

In accordance with the invention, the driver circuit produces increased current flow to result in a faster charge rate. In one embodiment of the invention, the driver circuit is used to provide fast charging of global data buses. This, for example, enables a write cycle followed immediately by a read cycle to be performed in a high frecuency memory IC. Other applications of the invention includes, for example, increasing the charge rate of address lines, command lines, control lines, read/write control lines (e.g., internal RAS, internal CAS, or internal read command), read/write data lines, or other types of buses.

Figure 1:
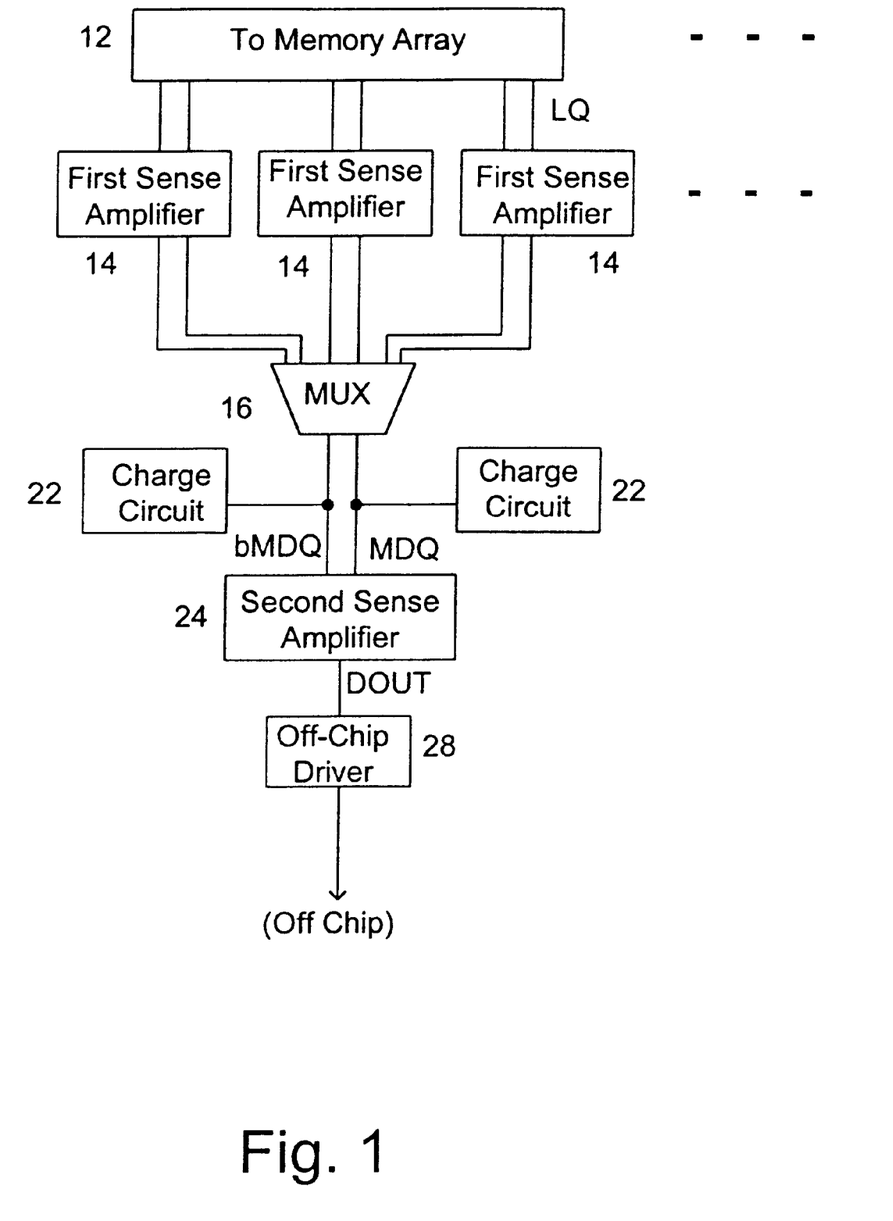
FIG. 1 shows a block diagram of a memory IC in accordance with one embodiment of the invention.

Referring to FIG. 1, a block diagram of an illustrative memory circuit 10 is shown. Other types of memory architectures are also useful. As shown, the memory chip comprises a plurality of first sense amplifiers 14 multiplexed by a MUX 16 to a second sense ampliier 24 over global data buses MDQ and bMDQ. First sense amplifiers 14 detect a charge from a memory array cell in a memory array 12, and second sense amplifier 24 translates this charge to a higher level (DOUT) to be driven out of the chip by off-chip driver 28. Charge circuits 22 are connected to global data buses MDQ and bMDQ.

In one embodiment, the charge circuit includes a driver circuit which is capable of charging the global data buses at an increased rate. The charge circuit is particularly useful in high frequency applications as it enables precharging of the data buses to the desired level within one clock cycle.

Figure 2:
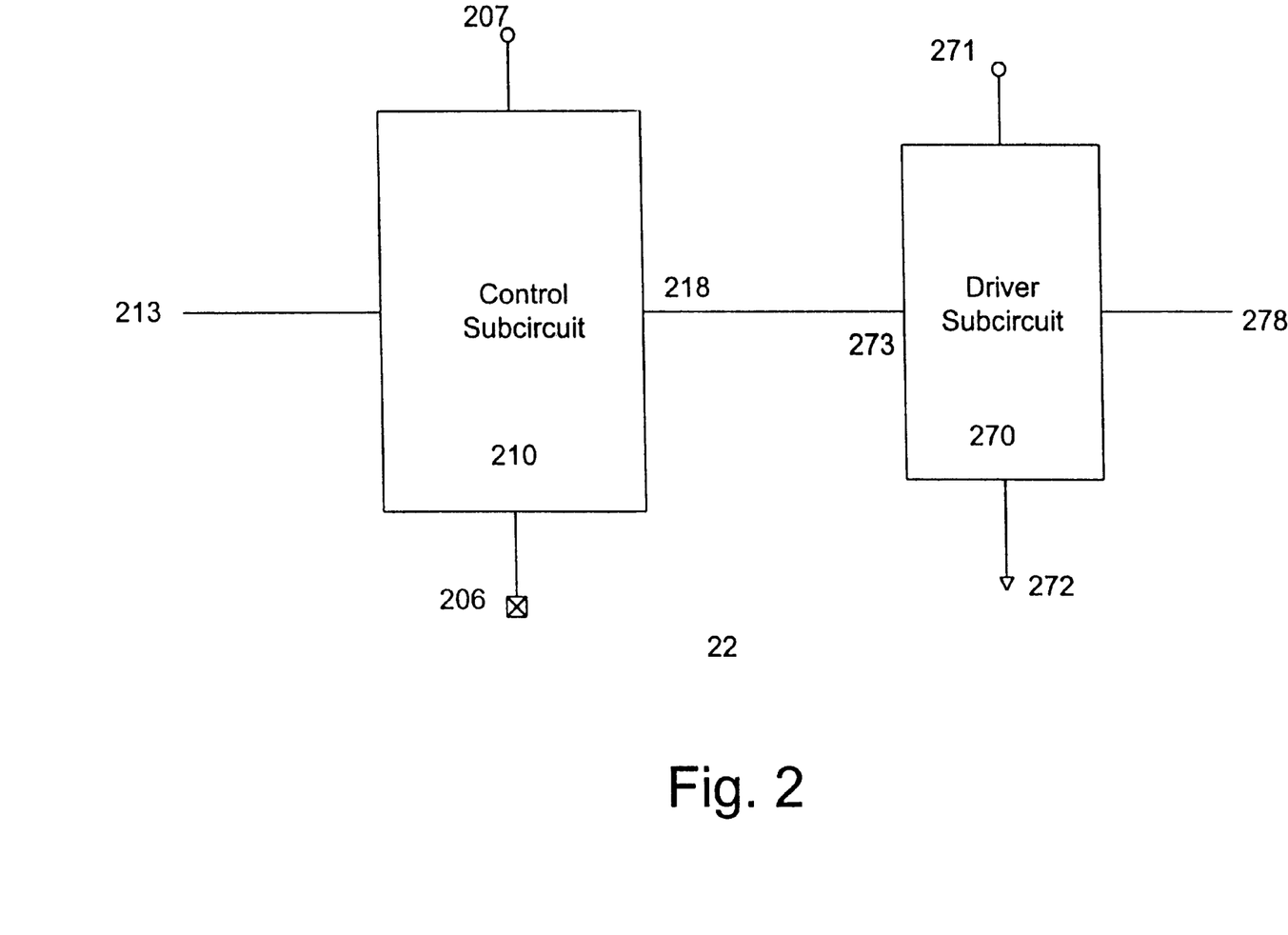
FIG. 2 shows a block diagram of a driver circuit in accordance with the invention.

FIG. 2 shows a block diagram of a charge circuit 22 in accordance with one embodiment of the invention. Illustratively, the charge circuit 22 comprises a driver subcircuit 270 and a control subcircuit 210.

The driver subcircuit comprises a driver transistor, representing the pull-up portion, for charging of a load coupled to an output 278 to the level of an upper power rail 271. In one embodiment, the driver transistor comprises a p-type field effect transistor (p-FET). The driver transistor includes first, second, and gate terminals. The first terminal is coupled to the upper power rail 271, the second terminal is coupled to the driver output 278, and the gate is coupled to a driver input 273. A lower power source or rail 272 can also be provided. The upper power rail comprises a voltage level at which the load is charged ($V_{blh}$). The lower power rail equals ground (GND).

Activating the pull-up portion of the driver subcircuit causes the driver transistor to be switched on or conductive, coupling the upper power rail to the output. This causes current to flow at the output, thereby charging the load to the level of the upper power rail. Deactivating the pull-up portion of the driver circuit switches the driver transistor off or renders it non-conductive, decoupling the driver output from the upper power rail.

To activate the pull-up portion, an active driver signal is provided at the driver input 273. Providing an inactive driver signal at the driver input deactivates the pull-up portion. In one embodiment, the inactive driver signal is a logic high signal; the active driver signal is a logic low signal.

In one embodiment, input 273 is coupled to an output 218 of the control subcircuit 210. The control subcircuit receives one or more input signals at its inputs. As shown, the control subcircuit comprises an input 213. The control subcircuit generates an active or inactive control output signal at its output in response to an input signal at its input. The active or inactive control output signal is equal to about a lower power rail 206 or an upper power rail 207. Typically, the upper power rail is equal to about the upper voltage of the core circuits ($V_{DD}$). In one embodiment, the active or inactive output control signal serves as the active or inactive driver input signal, respectively.

In accordance with the invention, the lower power rail 206 of the control subcircuit causes the control subcircuit to generate an active output control signal which increases the overdrive of the driver subcircuit. Increasing the overdrive of the driver subcircuit, which in accordance with the invention is achieved by increasing the magnitude of the gate overdrive voltage of the driver transistor, provides a boost in performance to increase the charge rate at the output 278. The overdrive voltage is the difference between a gate source voltage and the threshold voltage of the driver transistor. The amount of performance boost depends on the magnitude of the overdrive voltage or the magnitude by which the overdrive voltage is increased.

The power rail of the control circuit increases the magnitude of the active control signal to increase the overdrive voltage of the driver transistor. In one embodiment, the power rail increases the magnitude of the active driver signal by about 0.2–1.5 V, preferably about 0.2–1.0 V. Providing a power rail that increases the magnitude of the active control signal by other voltage levels are also useful, depending on the performance boost needed or design parameters.

The performance boost in the driver transistor or driver subcircuit is achieved by increasing the overdrive voltage. Such a technique boosts performance without needing to increase the voltage differential between the high and low logic levels of the load. This is contrary to conventional techniques which improve driver performance by increasing the voltage differential between the high and low logic levels.

In accordance with one embodiment of the invention, the lower power rail comprises a voltage level that is negative with respect to GND in order to cause the control subcircuit to generate a negative active control signal. The lower power rail comprises a voltage level of about −0.2 to −1.5 V, preferably about −0.2 to −1.0 V. Other negative voltage levels are also useful to serve as the lower power rail, depending on design requirements and design parameters.

In one embodiment, the lower power rail comprises a voltage equal to about the negative wordline low voltage. Alternatively, the lower power rail comprises the negative array back bias voltage ($V_{BB}$) of a memory IC. The use of the negative wordline voltage or $V_{BB}$ is advantageous since a negative potential is provided without requiring an additional power source. The negative wordline voltage or $V_{BB}$ is, for example, about −0.5 V.

The use of a lower power rail that is negative with respect to GND (negative power rail) is contrary to conventional driver circuits. Conventional driver circuits comprise a lower power rail that is equal to GND. Providing a negative lower power rail advantageously enables a performance boost in the driver subcircuit without needing to increase the voltage differential between the high and low logic levels. The performance boost provides, for example, faster charging of the global data basses of a memory IC.

Figure 3:
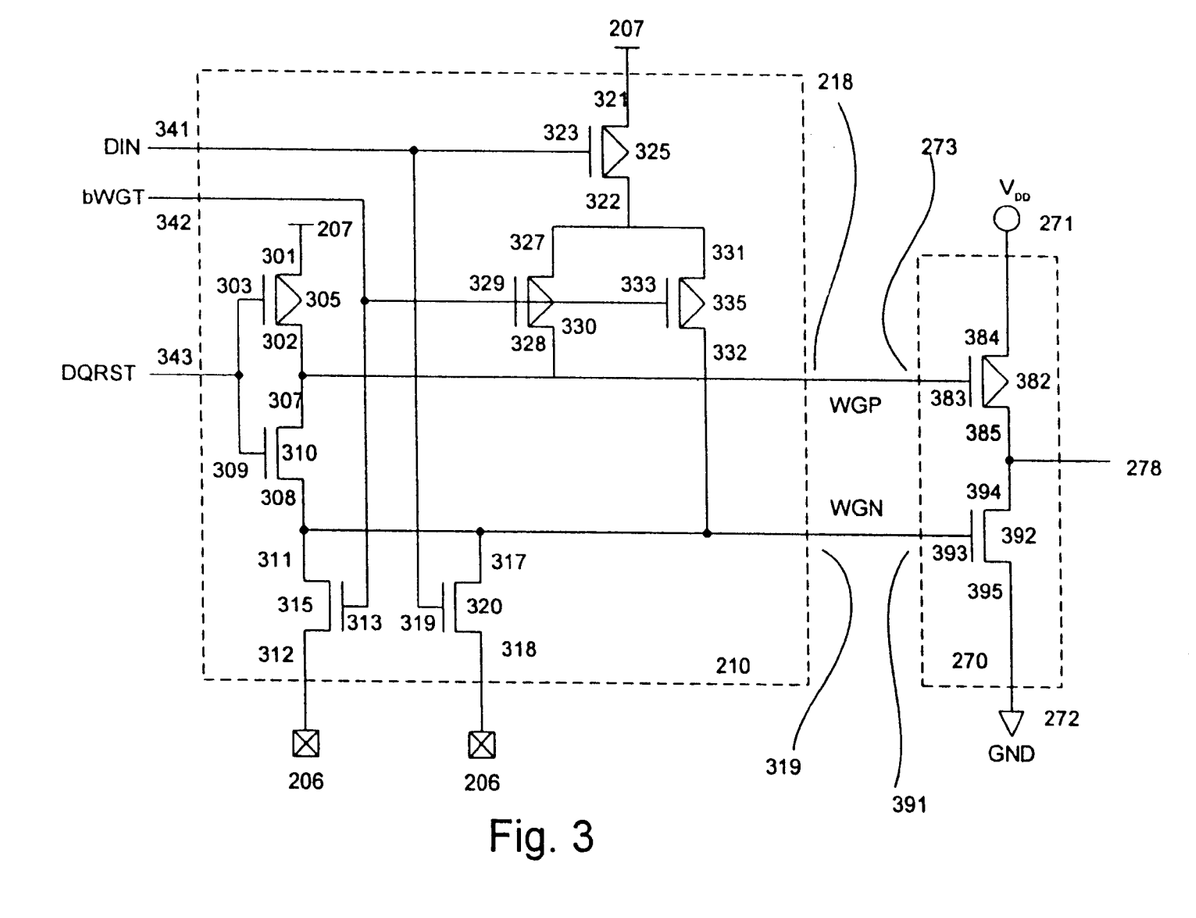
FIG. 3 shows a diagram of a driver circuit in accordance with one embodiment of the present invention.

Referring to FIG. 3, one embodiment of the invention is shown. The driver subcircuit 270 comprises a first transistor 382. The first transistor is a driver transistor of the driver subcircuit, representing the pull-up portion. As shown, the driver transistor is a p-FET. The transistor includes first, second, and gate terminals 384, 385, and 383. The first terminal is coupled to an upper power source 271 ($V_{blh}$). $V_{blh}$, which for example is equal to the upper voltage level of the bitlines, can be less than $V_{DD}$. A typical value for $V_{blh}$ can be about ⅔ $V_{DD}$. Other values, such as ¾ $V_{DD}$ or $V_{DD}$, are also useful. The second electrode is coupled to the driver output 278. The gate is coupled to the driver input 273.

A second transistor 392 is provided, representing the pull-down portion. The second transistor, which illustratively is an n-type FET (n-FET), comprises first, second, and gate terminals 394, 395, and 393. The first terminal is coupled to the output and the second terminal of the first transistor. The second terminal is coupled to a second power source 272, which is equal to GND.

Transistors 382 and 392 can operate in a push-pull configuration. That is one transistor is on while the other is off. Also, both transistors 382 and 392 can be off to tri-state the output. To activate the pull-up portion of the driver subcircuit, an active signal (logic 0) is provided at input 273 and an inactive signal (logic 0) is provided at input 391. This renders transistor 382 conductive and transistor 392 non-conductive, thereby causing the output to be equal to about the $V_{blh}$. To activate the pull-down portion of driver subcircuit, an inactive signal (logic 1) is provided at input 273 and an active signal (logic 1) is provided at input 391. This renders transistor 392 conductive and transistor 382 non-conductive, thereby causing the output to be equal to about GND. To tri-state the driver subcircuit, an inactive signal (logic 1) is provided at input 273 and an inactive signal (logic 0) is provided at input 391. Deactivating the pull-up portion of the driver circuit decouples the upper power rail from the output. Deactivating the pull-down portion of the driver circuit decouples the output from the lower power rail 272.

The control subcircuit 210 receives one or more inputs and generates one or more output signals. The output signals are used to control or to derive signals to control the operation of the driver subcircuit. In one embodiment, the control subcircuit receives inputs related to the charging of the global data buses of a memory IC.

Illustratively, the control subcircuit receives input signals to control the charging and discharging of the global data bus MDQ. In one embodiment, the control circuit receives input signals DIN, bWGT, and DQRST. The b prefix indicates that the signal is an active low signal. To control the charging and discharging of the complement global data bus bMDQ, input signals bDIN, bWGT, and DQRST can be used. The DIN signal represents the data in signal corresponding to the data that is to be written to memory. The bWGT and DQRST signals are used to determine whether a write, read, or precharge operation is to be performed. The operations corresponding to the bWGT and DQRST signals are described in Truth Table 1.

TRUTH TABLE 1

| DQRST | bWGT | Operation |
|-------|------|-----------|
| 0 | 0 | Illegal |
| 0 | 1 | Read |
| 1 | 0 | Write |
| 1 | 1 | Precharge |

The value of the DIN signal during a write operation determines whether it is a write "1" or write "0" operation. For other operations, the value of DIN has no effect (don't cares). Writing a 1 or a 0 to memory depends on DIN signal. In one embodiment, a write "1" is performed if DIN equals a logic 1 during a write operation and a write "0" is performed if DIN is equal to a logic 0 during a write operation. The global data bus MDQ is precharged during a write "1" and discharged during a write "0" operation. The complement global data bus bMDQ, on the other hand, is precharged during a write "0" and discharged during a write "1" operation. Both MDQ and bMDQ are precharged to $V_{blh}$ during a precharge operation. During a read or an illegal operation, the buses are disconnected from the driver subscircuit. The outputs WGN and WGP of the control subcircuit corresponding to the different operations on the global data bus MDQ are described in Table 2.

TABLE 2

|  | WGN | WGP |
|--|-----|-----|
| Read | 0 | 1 |
| Precharge | 0 | 0 |
| Write 0 | 1 | 1 |
| Write 1 | 0 | 0 |

Depending on the operation, an active WGP signal (logic 0) charges the MDQ. In accordance with one embodiment of the invention, the active WGP signal is negative with respect to GND in order to increase the overdrive of the overdrive subcircuit. In one embodiment, the WGP active signal is equal to about the negative wordline low voltage or $V_{BB}$.

In one embodiment, the control subcircuit for controlling MDQ employs non-sequential logic to generate the output signals WGP and WGN in response to the input signals DIN, bWGT, and DQRST. Implementing the control subcircuit with non-sequential logic improves performance by saving one or more delay stages. The use of input signals bDIN, bWGT, and DQRST to generate output signals to control bMDQ is also useful.

As shown, transistors 305, 310, and 315 are configured in series. Transistor 305 is a p-FET, and transistors 310 and 315 are n-FETs. An upper rail 207, such as $V_{DD}$, is coupled to first terminal 301 of transistor 305. In one embodiment, $V_{DD}$ is about 2V. Other voltage levels are also useful.

A second terminal 312 of transistor 315 is coupled to a lower power rail or lower power source 206 that is negative with respect to GND. In one embodiment, the lower power rail comprises a voltage level of about −0.2 to −1.5 V, preferably about −0.2 to −1.0 V. Other negative voltage levels are also useful to serve as the lower power rail, depending on design requirements and design parameters. In one embodiment, the lower power rail comprises the negative wordline voltage or $V_{BB}$. The negative wordline voltage or $V_{BB}$ is, for example, about −0.5 V.

Output 218, which provides the WGP signal, is coupled to a first terminal 307 of transistor 310 and a second terminal 302 of transistor 305. Output 319, which provides the WGN signal, is coupled to a first terminal 311 of transistor 315 and a second terminal 308 of transistor 310. Also coupled to output 319 is a first terminal 317 of a transistor 320. Transistor 320, for example, is an n-FET. A second terminal 318 is coupled to the lower power rail 206. The DIN signal is provided at a gate 319 for controlling transistor 320. Whenever an n-FET is connected to the lower power rail, the body is connected to the lower power rail.

The control subcircuit also includes transistors 325, 330, and 335. The transistors 325, 330, and 335 are, for example, p-FETs. As shown, transistor 325 is coupled in series with transistors 330 and 335. Transistors 330 and 335 are coupled in parallel. A first terminal 321 of transistor 325 is coupled to $V_{DD}$, and the second terminal 322 is coupled to first terminals 327 and 331 of transistors 330 and 335. A second terminal 228 of transistor 330 is coupled to output 218, and a second terminal 332 of transistor 335 is coupled to output 319. The DIN signal is provided at a gate 323 to control transistor 325. Transistors 330 and 335 are controlled by the bWGT signal.

Such a control circuit produces the results as described in Tables 1 and 2. A control circuit that generates outputs in response to inputs in accordance with other truth tables can also be useful. The logic of the active signal or signals can be switched by, for example, using p-FETs instead or n-FETS and vice-versa.

As described, output 218 is coupled to the lower power rail 206 when an active WGP signal is produced in response to the inputs. Coupling the lower power rail to the output produces an active WGP signal that is negative with respect to GND. Providing a negative active WGP signal increases the magnitude of the gate overdrive voltage at transistor 382. This causes transistor 382 to be more conductive, increasing the current flow rate from $V_{blh}$ to the output 278 for driving the output load.

Figure 4:
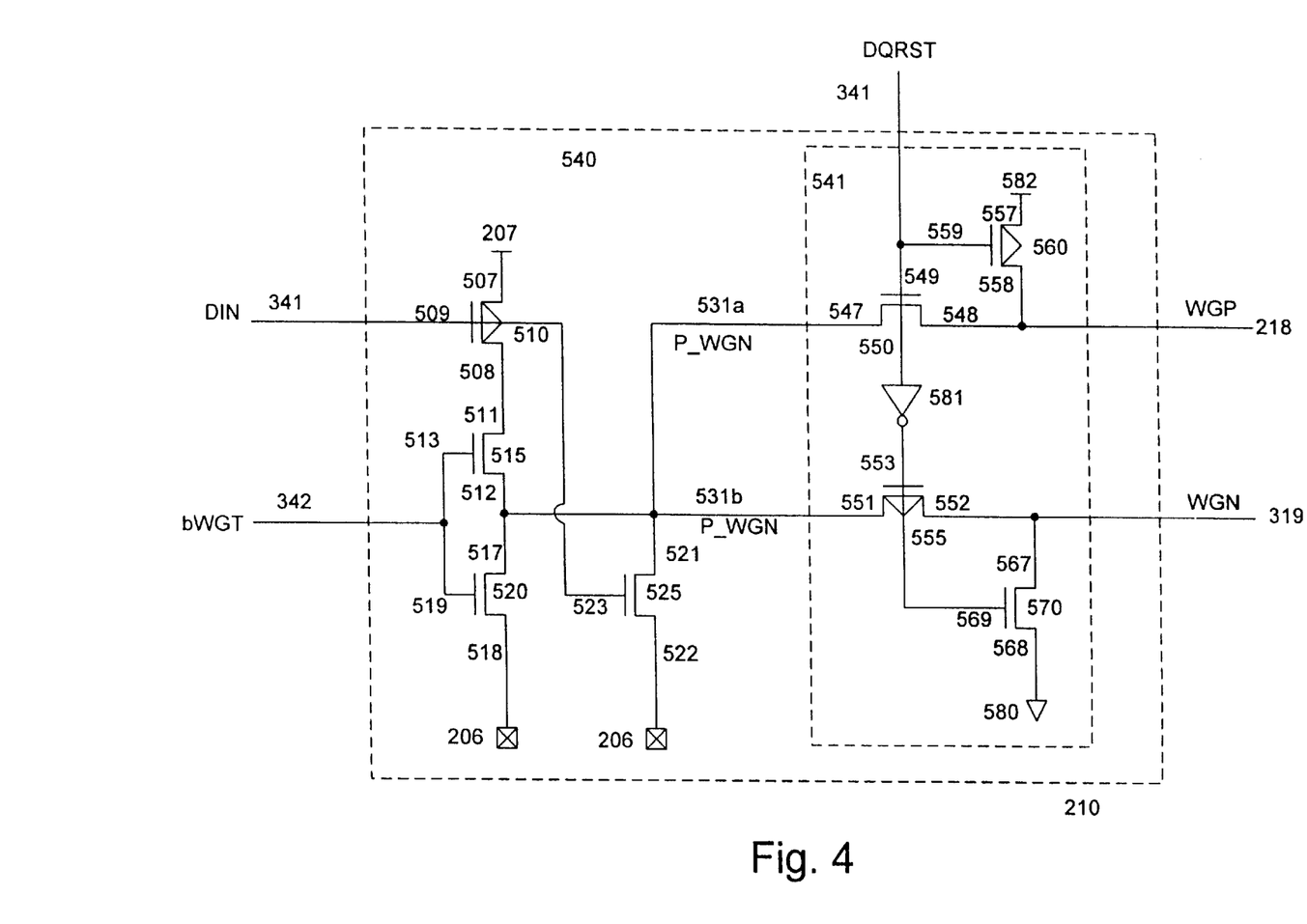
FIG. 4 shows alternative embodiments of the control subcircuit to control the operation of a driver subcircuit.

FIG. 4 shows an alternative embodiment of a control subcircuit 210. The control subcircuit controls the operation of MDQ. As shown, control subcircuit comprises inputs 341, 342, and 343 for receiving DIN, bWGT, and DQRST signals, respectively. In response to the input signals, the control subcircuit generates output signals WGP and WGN at outputs 218 and 319. Input signals bDIN, bWGT, and DQRST signals can be used to generate output signals to control the operation of bMDQ.

As shown, the control subcircuit comprises first and second logic block 540 and 541. The first logic block receives input signals DIN and bWGT and generates an output signal P_WGN. In one embodiment, the output signal P_WGN is provided at first and second paths 531a and 531b. The input signals determine the desired operation, such as read, precharge, write "0" or write "1." The output $P_{13}$ WGN corresponding to the different operations are described in Table 3.

TABLE 3

| | P_WGN |
|---|---|
| Read | Don't care |
| Precharge | 0 |
| Write 0 | 1 |
| Write 1 | 0 |

The second logic block receives DQRST and P_WGN signals. The P_WGN is provided to the second logic block in first and second paths 531a–b. In response to an active DQRST signal (logic 1), the P_WGN signal from the first and second paths is transmitted through to serve as the WGP or WGN output signal at outputs 218 and 319. An inactive DQRST signal (logic 0) causes the P_WGN signal to be isolated from the outputs. Instead, an upper power rail 582 and a lower power rail 580 are coupled to outputs 218 and 319 to generate the output signals WGP and WGN. The inputs DQRST, DIN, and bWGT generate outputs WGP and WGN in accordance with Tables 1 and 2.

In one embodiment, the first logic block comprises transistors 510, 515, 520, and 525. As shown, transistors 510 and 515 are p-FETs, and transistors 520 and 525 are n-FETs. Transistors 510, 515, and 520 are coupled in series. A first power source or upper ravel 207, such as $V_{DD}$, is coupled to first terminal 507 of transistor 510. A second terminal 518 of transistor 520 is coupled to a negative lower power rail 206 in accordance with various embodiments of the invention. Input 342, which receives the bWGT signal, is coupled to gates 513 and 519 of transistors 515 and 520. Input 341 (DIN signal) is coupled to gates 509 and 523 of transistors 510 and 525.

The first terminal 521 of transistor 525 is coupled to the output paths 531a–b to provide the P_WGN signal, and the second terminal 522 of the transistor 525 is coupled to the negative lower power rail 206. Input signal DIN controls the transistor 525, connecting or disconnecting the lower power rail 206 from signal paths 531a–b. Signal paths 531a–b (P_WGN signal) are also coupled to the first terminal 517 of transistor 520 and second terminal 512 of transistor 515.

The second logic block 541 comprises transistors 550, 555, 560, 570 and an inverter 581. As shown, transistors 555 and 560 are p-FETs and transistors 550 and 570 are n-FETs. A first terminal 547 of transistor 550 is coupled to output signal path 531a from the first logic block 540, and a second terminal 548 of transistor 550 is coupled to output 218. A second terminal 558 of transistor 560 is coupled to the output 218. Coupled to a first terminal 557 of transistor 560 is an upper power rail 582, such as $V_{DD}$. Input 343 is coupled to both gates 549 and 559 of transistors 550 and 560.

A first terminal 551 of transistor 555 is coupled to output signal path 531b from the first logic block 540, and a second terminal 552 of transistor 555 is coupled to output 319. A first terminal 567 of transistor 570 is coupled to the output 319. Coupled to a second terminal 568 of transistor 570 is lower power rail 580 (GND). The inverter 581 inverts the DQRST signal from input 343. The inverted DQRST signal is provided to gates 553 and 569 for controlling transistors 555 and 570. An active DQRST signal enables control subcircuit to generate an active/inactive WGP signal and an inactive/active WGN signal, activating the pull-up/pull-down portion of the driver subcircuit. Conversely, an inactive DQRST signal disables the control subcircuit and generates an inactive WGP signal and an inactive WGN signal, tri-stating the driver subcircuit. In one embodiment, the active DQRST signal is a logic 1 signal.

A control subcircuit that generates outputs in response to inputs in accordance with other truth tables is also useful. The logic of the active signal or signals can be switched by, for example, using p-FETs instead or n-FETS and vice-versa.

Figure 5A:
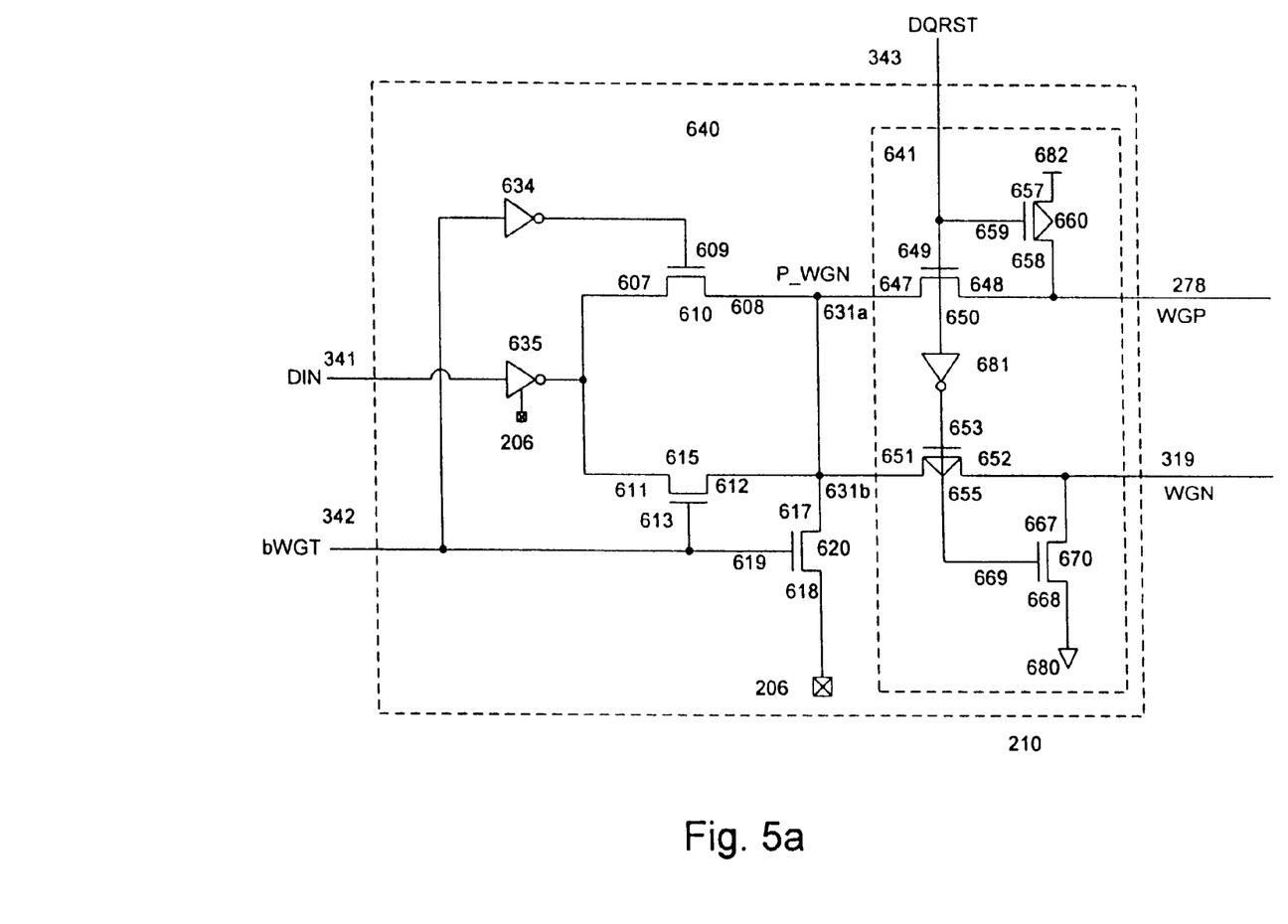
FIGS. 5a–b show another embodiment of the control subcircuit.

FIG. 5a shows another embodiment of a control subcircuit. The control subcircuit 210 comprises inputs 341, 342, and 343 for receiving DIN, bWGT, and DQRST signals, respectively. In response to the input signals, the control subcircuit generates output signals WGP and WGN at outputs 218 and 319. Input signals bDIN, bWGT, and DQRST signals can be used to generate output signals to control, for example, the operation of bMDQ.

The control subcircuit comprises first and second logic block 640 and 641. The first logic block receives input signals DIN and bWGT and generates an output signal P_WGN at first and second signal paths 631a–b. The input signals determine the desired operation, such as read, precharge, write "0" or write "1." The signal P_WGN corresponding to the different operations are described in Table 3.

The second logic block is similar to second logic block 541 of FIG. 4. The second logic block receives input signal DQRST and the P_WGN signal from the first and second signal paths 631a–b. In response to an active DQRST signal (logic 1), the P_WGN signal on signal paths 631a and 631b is transmitted through to the output 218 and 319. An inactive DQRST signal isolates the P_WGN signal on signal paths 631a and 631b from outputs 319 and 218 and connects upper power rail 682 ($V_{DD}$) to output 218 (WGP) and lower rail 680 to output 319 (WGN), resulting in a tri-stating of the driver subcircuit. The inputs DQRST, DIN, and bWGT generate outputs WGP and WGN in accordance to Tables 1 and 2.

Figure 5B:
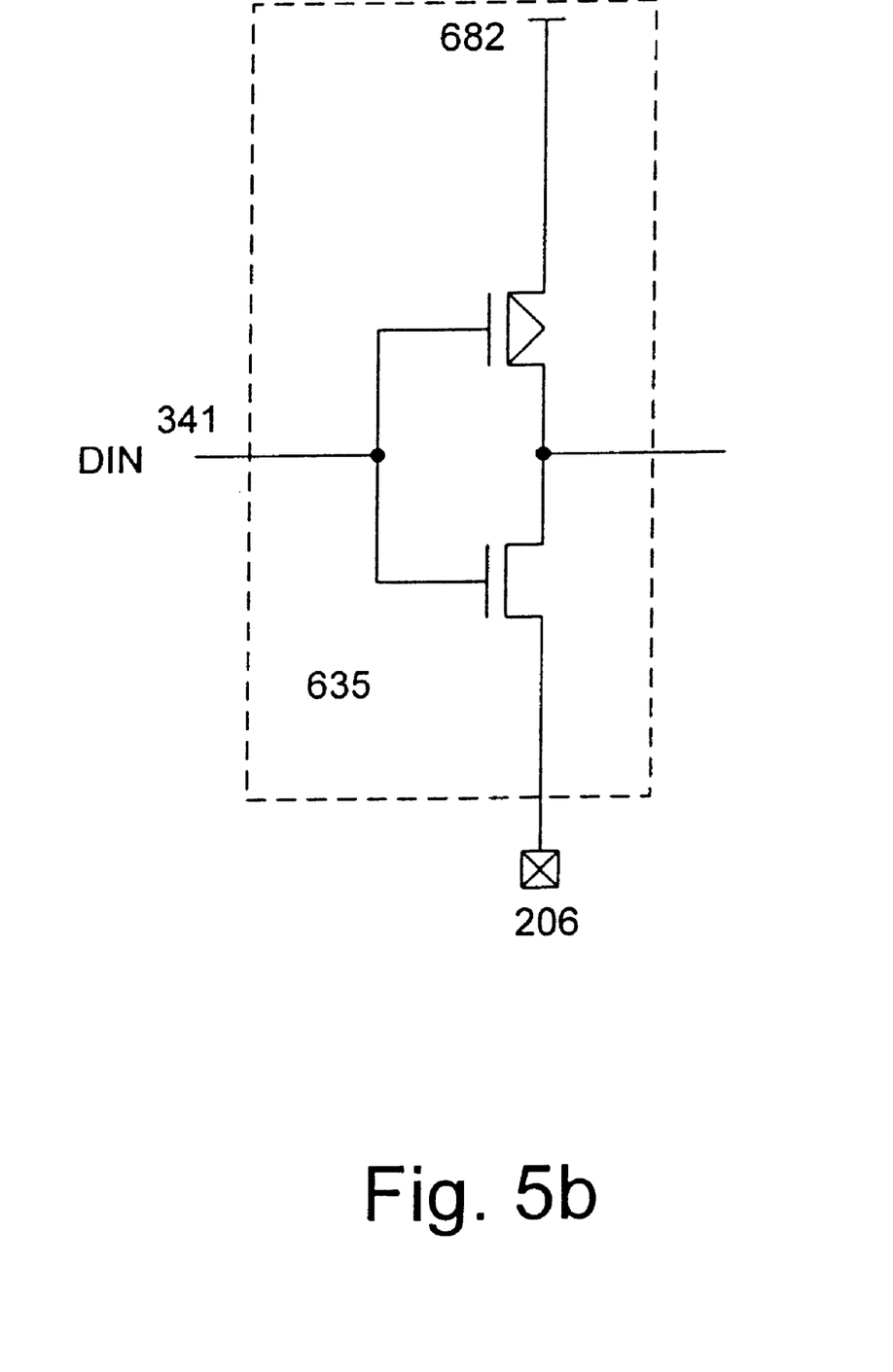

Illustratively, the first logic block comprises transistors 610, 615, and 620. Transistors 610 and 620 are n-FETs, and transistor 615 is a p-FET. First terminals 607 and 611 of transistors 610 and 615 are coupled in common to an inverter 635 that inverts the input signal DIN at input 341. The inverter 635 comprises a negative lower power rail 206 in accordance with various embodiments of the invention. The inverter 635 is shown in FIG. 5b. A second terminal 608 of transistor 610 is coupled to output 631a of the first logic block. Coupled to output 631b is a second terminal 612 of transistor 615.

A first terminal 617 of transistor 620 is coupled to both outputs 631a and 631b as well as second terminals of transistors 610 and 615. A second terminal 618 of transistor 620 is coupled to a negative lower power rail 206 in accordance with various embodiments of the invention. Input 342 (bWGT) is coupled to gates 613 and 619 of transistors 615 and 620. An inverter 634 is provided to invert input signal from input 342. The inverted input signal from input 342 is coupled to a gate 609 to control transistor 610. Output signal P_WGN from the first logic block is provided at inputs of the second logic block.

As described, the control circuit generates outputs as described in Tables 1 and 2. A control subcircuit that generates outputs in response to inputs in accordance with other truth tables is also useful. The logic of the active signal or signals can be switched by, for example, using p-FETs instead or n-FETS and vice-versa.

Figure 6:
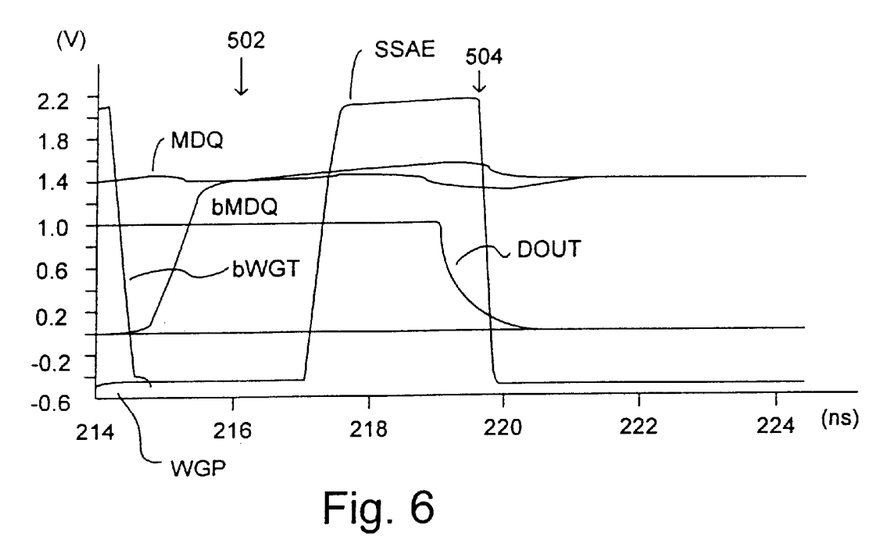
FIG. 6 shows a timing diagram for a driver circuit in accordance with one embodiment of the invention.

FIG. 6 shows a timing diagram of the driver circuit as described in FIG. 3. The timing diagram depicts a read after write cycle. During a write "1" operation, the gate voltage signal WGP of the pull-up portion of the driver subcircuit of the MDQ-line is below ground; the gate voltage signal WGP of the pull-up portion of the driver subcircuit of the bMDQ-line is high (about 2 V). After the write "1" operation, a precharge operation 502 starts to charge the MDQ and the bMDQ line to $V_{blh}$ (which is here about 1.5V). The bMDQ line quickly rises to the up-level in a 2 nanosecond (ns) time window from approximately 214 ns to 216 ns. This is possible because the corresponding gate voltage signal WGP of the pull-up portion of the driver subcircuit of the bMDQ-line quickly drops below zero to about –0.5V. A read operation 504 follows the precharge operation 502. The read operation is indicated by the SSAE (secondary sense amplifier enable) signal going positive. The secondary sense amplifier senses a negative differential signal between MDQ and bMDQ, which corresponds to reading a "0". As a result, the corresponding data out signal (DOUT) falls to indicate that a read "0" operation has been performed successfully.

Figure 7:
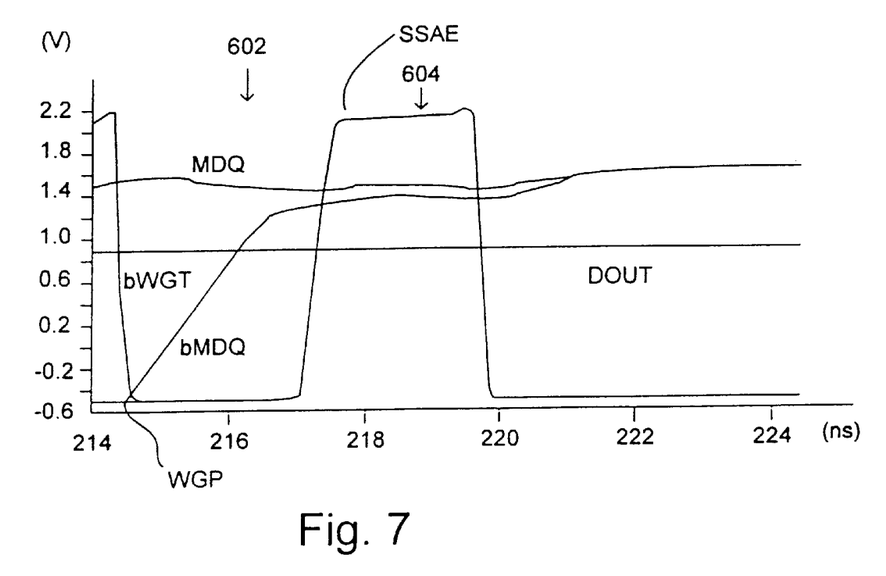
FIG. 7 shows a timing diagram for a conventional driver circuit.

Referring now to FIG. 7, a timing diagram of a conventional driver circuit without a negative lower power rail is shown. The timing diagram indicates that the conventional driver circuit is unable to perform a read operation 604 after a write operation. A precharge operation 602 is performed between the write and read operations. It is essential that the MDQ and bMDQ have the same voltage before the read operation starts. If not, than incorrect reading can occur since the differential read voltage is quite small (typically about 200 mV). The gate voltage signal WGP to the driver subcircuit for global data bus bMDQ is driven low (0 volts). As shown, bMDQ rises towards its up-level voltage. However, the overdrive is less without the negative lower power rail, and global data buses do not equalize prior to the start of the read operation 604. Due to this incomplete equalization, incorrect data is read and DOUT remains high, indicating that a read "1" has occurred. As a result, such a circuit is incapable of operating at frequencies as high as circuits of the present invention.

Figure 8:
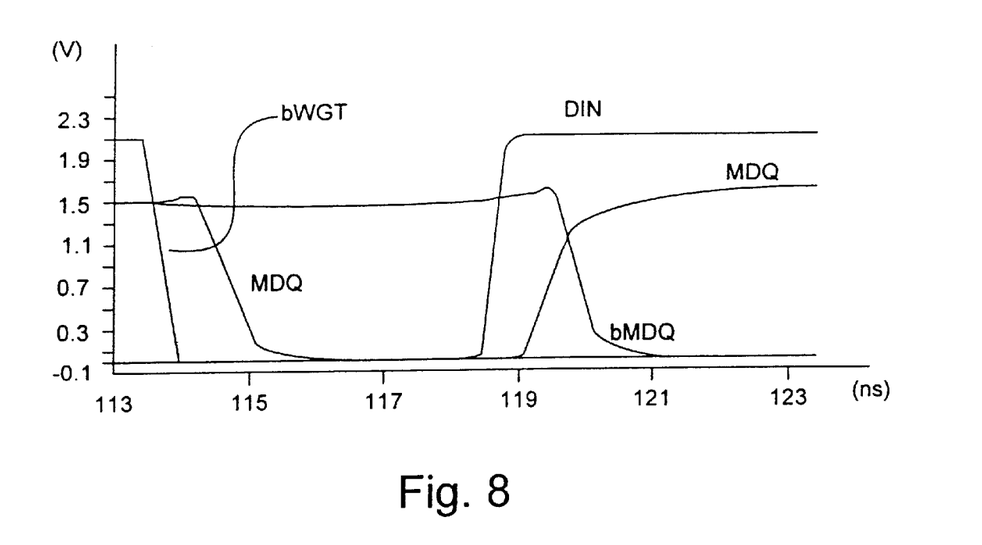
FIG. 8 shows a timing diagram for a driver circuit in accordance with one embodiment of the invention.

FIG. 8 shows a timing diagram of a write "1" after a write "0" performed by the driver circuit of the present invention. Gate voltage WGP (not shown) is driven below GND, and MDQ increases to its up-level in a 2 ns time window from time 119 ns to 121 ns after the previous write "0" operation, thus enabling the second write operation in the next cycle.

Figure 9:
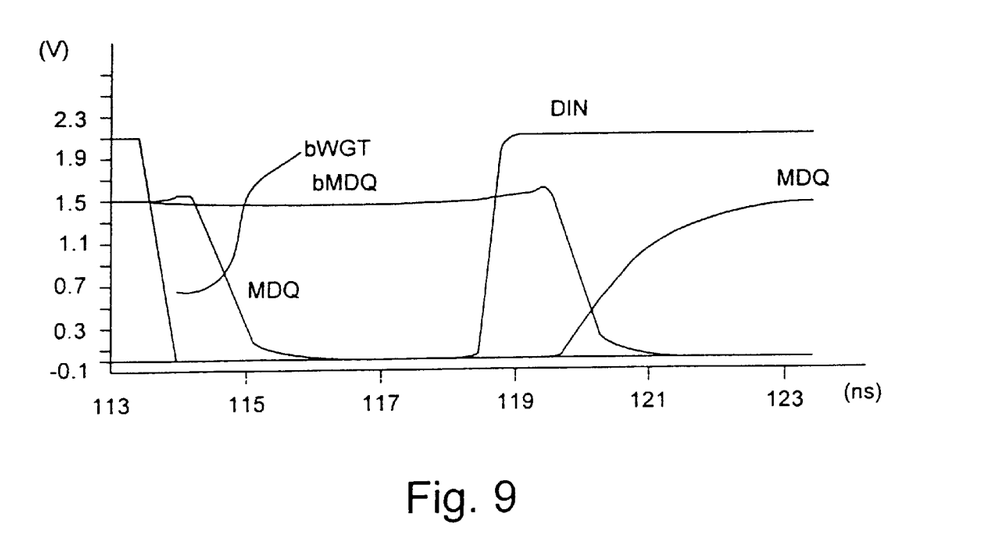
FIG. 9 shows a timing diagram for a conventional driver circuit.

Referring now to FIG. 9, a timing diagram of a write after write performed by a conventional driver circuit is shown. As shown by the timing diagram, the write performance of the conventional driver circuit is worse; the time necessary to charge up MDQ increases by approximately a factor of two in comparison with the present invention. MDQ and bMDQ curves of FIG. 9 are charged more slowly as compared to MDQ and bMDQ curves of FIG. 8.

Further advantages of the driver circuit include reduced power dissipation. In accordance with the present invention, buses may swing between states with increased speeds without requiring higher operating voltages. This is enabled by increasing the overdrive of the driver transistor of the driver subcircuit. This is achieved without dissipating additional power, resulting in reduced power dissipation in comparison with the conventional technique. Depending on the design parameters, a power reduction of about a 33% can be achieved. Due to the increased charge rate and reduction in power dissipation, the present invention provides a driver circuit for use in high frequency semiconductor ICs.

Although the transistors and signals are shown in the figures as a certain type and signal state, the invention shall be construed to incorporate circuits and signals of the opposite type and state. For example, n-FETs may be changed to p-FETs and signals, i.e. logic high may be changed to logic low, to achieve the results in accordance with the present invention described herein.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A driver circuit comprising:
   a driver subcircuit having a pull-up portion, the pull-up portion comprising a driver transistor, wherein the driver transistor comprises first, second, and gate terminals, the first terminal being coupled to an upper power source, the second terminal being coupled to an output of the driver subcircuit, and the gate terminal being coupled to an input of the driver subcircuit; and
   a control subcircuit comprising a control output coupled to the input of the driver subcircuit and a negative lower power rail; the negative power rail causing the control subcircuit to generate an active control output overdrive voltage of the driver transistor.

2. The driver circuit according to claim 1 wherein the active driver control signal is equal to a voltage at about the negative power rail.

3. The driver circuit according to claim 2 wherein the negative lower power rail comprises a voltage of about –0.2 to –1.5 V.

4. The driver circuit according to claim 2 wherein the negative lower power rail comprises a voltage equal to about a negative wordline low voltage.

5. The driver circuit according to claim 2 wherein the negative lower power rail comprises a voltage equal to about a array back bias voltage of a memory IC.

6. The driver circuit according to claim 1 wherein the output of the driver subcircuit is coupled to a bus.

7. The driver circuit according to claim 6 wherein the bus comprises a global data bus of an IC.

8. The driver circuit according to claim 6 wherein the bus comprises a command bus of an IC.

9. The driver circuit according to claim 6 wherein the bus comprises an address line of an IC.

10. The driver circuit according to claim 6 wherein the bus comprises a control line of an IC.

11. The driver circuit according to claim 6 wherein the bus comprises read-write data lines of an IC.

12. The driver circuit according to claim 11 wherein the IC comprises a memory IC.

13. The driver circuit according to claim 10 wherein the IC comprises a memory IC.

14. The driver circuit according to claim 9 wherein the IC comprises a memory IC.

15. The driver circuit according to claim 8 wherein the IC comprises a memory IC.

16. The driver circuit according to claim 7 wherein the IC comprises a memory IC.

* * * * *